United States Patent
Menschig (10) Patent No.: US 7,165,669 B2
(45) Date of Patent: Jan. 23, 2007

(54) METHOD AND DEVICE FOR CARRYING OUT WORKING STEPS ON MINIATURIZED MODULES

(76) Inventor: Arnd Menschig, Bachstrasse 41, Weil im Schoenbuch (DE) 71093

( * ) Notice: Subject to any disclaimer, the term of this patent is extended or adjusted under 35 U.S.C. 154(b) by 0 days.

(21) Appl. No.: 11/036,301

(22) Filed: Jan. 14, 2005

(65) Prior Publication Data

US 2005/0139449 A1 Jun. 30, 2005

Related U.S. Application Data

(63) Continuation of application No. 10/620,861, filed on Jul. 15, 2003, now abandoned, which is a continuation of application No. 09/718,229, filed on Nov. 21, 2000, now Pat. No. 6,596,115, which is a continuation of application No. PCT/EP99/03465, filed on May 20, 1999.

(30) Foreign Application Priority Data

May 23, 1998 (DE) ................................. 198 23 196

(51) Int. Cl.
*B65G 25/00* (2006.01)
(52) U.S. Cl. ................................. 198/468.2; 198/468.4; 198/750.11; 198/750.12; 414/751.1; 414/752.1
(58) Field of Classification Search ............. 198/468.2, 198/468.4, 750.11, 750.12; 414/751.1, 751.2, 414/752.1; 29/739–742, 833; 901/1, 40, 901/47
See application file for complete search history.

(56) References Cited

U.S. PATENT DOCUMENTS

| | | | |
|---|---|---|---|
| 3,901,180 A | 8/1975 | Allen et al. | |
| 4,473,935 A | 10/1984 | Tatsuura et al. | |
| 4,946,021 A | 8/1990 | Murphy | |
| 5,018,936 A | 5/1991 | Izumi et al. | |
| 5,092,729 A | 3/1992 | Yamazaki et al. | |
| 5,133,444 A | 7/1992 | Thomason | |
| 5,332,013 A | 7/1994 | Sugita et al. | |
| 5,377,896 A | 1/1995 | Lopata | |
| 5,672,044 A | 9/1997 | Lemelson | |
| 5,736,464 A | 4/1998 | Opower | |
| 6,080,957 A | 6/2000 | Menschig et al. | |
| 6,596,115 B1 * | 7/2003 | Menschig | ................... 156/230 |

FOREIGN PATENT DOCUMENTS

| | | |
|---|---|---|
| DE | 32 22 657 | 12/1982 |
| DE | 196 37 822 | 3/1998 |

* cited by examiner

*Primary Examiner*—Douglas Hess
(74) *Attorney, Agent, or Firm*—Lipsitz & McAllister, LLC (57) ABSTRACT

In order to provide a method of carrying out working steps in at least one work station on miniaturised modules which are held by a module carrier provided with a holding device, whereby the method enables a plurality of processing steps to be carried out on a module, it is proposed that the module be moved by one of the module carriers to a plurality of work stations for carrying out the working steps and that it be precisely positioned for carrying out one of the working steps by means of a relative movement between the module carrier and the currently relevant one of the plurality of workstations, and in that the positioning of the module relative to the module carrier be maintained for carrying out the working steps.

41 Claims, 7 Drawing Sheets

METHOD AND DEVICE FOR CARRYING OUT WORKING STEPS ON MINIATURIZED MODULES

This application is a continuation of U.S. application Ser. No. 10/620,861 filed Jul. 15, 2003, now abandoned, which is a continuation of U.S. application Ser. No. 09/718,229 filed Nov. 21, 2000, now U.S. Pat. No. 6,596,115, which is a continuation of international application no. PCT/EP99/03465 filed May 20, 1999, which claims priority of German application no. 198 23 196 filed May 23, 1998.

A method of this type for carrying out working steps on miniaturised modules in at least one work station is known from the German patent 196 37 822, wherein the modules are held by a module carrier which is provided with a holding device.

However, a method of this type merely envisaged a single work station so that further processing of a module was not possible.

Consequently, the object of the invention is to provide a method which enables a plurality of working steps to be carried out on a module.

In accordance with the invention, this object is achieved in the case of a method of the type described hereinabove in that, for the purposes of carrying out the working steps, the module is moved by the same module carrier to a plurality of work stations and is precisely positioned for carrying out one of the working steps by means of a relative movement between the module carrier and the currently relevant one of the plurality of work stations, and in that the positioning of the module relative to the module carrier is maintained for carrying out the working steps.

The advantage of the solution in accordance with the invention can be seen primarily in that the number of possible working steps is multiplied by the number of work stations provided, and in that it is nevertheless possible to carry out the respective working steps with greater precision, despite having a plurality of work stations, by virtue of the precise positioning of the module carrier relative to the respective work station, and in that this precision is further improved for the relevant working step by virtue of the fact that the positioning of the module relative to the module carrier is maintained and hence any imprecision that could be caused thereby is excluded.

In principle, the positioning of the module relative to the module carrier could also be maintained if the module carrier were to deposit the module in the relevant work station for the associated processing thereof, although in this case it would be necessary to fix the module in the work station in a precise manner in order to enable the module carrier to subsequently pick up the module with the same level of precision. On the other hand, apart from the fact that such precise fixing in the respective work station signifies a considerable degree of effort, the subsequent picking up of the module by the module carrier will nevertheless be associated with a loss of precision.

For this reason, a particularly advantageous solution envisages that the module should continue to be held by the holding device in the module carrier whilst carrying out a sequence of working steps. By virtue of this solution, there will thus be no loss of precision whatsoever since the module will continue to be held by the holding device just as before, and hence the individual working steps in the individual work stations involve no loss of precision whatsoever in terms of orienting the module relative to the module carrier.

Such a process of carrying out the working steps in the case where the module is held by the module carrier can be carried out in an especially expedient manner if the sequence of working steps is effected in a mechanically non-contact making manner so that no great demands will be made in regard to the fixing of the module relative to the module carrier and hence this will be effected without the application of large forces which could, in turn, lead to a displacement of the module relative to the module carrier and consequently negatively affect the degree of precision.

It would be possible to use various means for effecting such a mechanically non-contact making process. For example, it would be conceivable to carry out such a mechanically non-contact making process by means of elementary particles, neutral particles or ions.

However, the working steps can be carried out in a particularly simple manner if they are carried out by means of electromagnetic radiation since such radiation can easily be produced and employed for the individual working steps and, for example, it can be focused.

Within the framework of a working step in accordance with the invention, one could conceive of the most varied of functions, whereby every function which, for example, could be used for producing a miniaturised module, would fall thereunder.

For example, one could envisage that a process of fine positioning the module be carried out as one of the working steps so that the subsequent processing thereof will be carried out with the greatest possible degree of precision.

It has proved to be particularly advantageous hereby, if an exact position of the module relative to the module carrier is determined during the fine positioning working step and if this is then made available for the subsequent working steps. For example, it is thereby possible, when subsequently positioning the module carrier relative to the then relevant work station, to inevitably achieve the same level of precision in regard to the position of the module relative to the work station due to the precisely known position of the module relative to the module carrier.

Such a process of determining the position of the module relative to the module carrier could be carried out in a manner similar to a calibration process for example, that is to say, the deviation of the position of the module from an ideal position relative to the module carrier is determined, whence the positioning required for the subsequent working steps can be corrected.

This process creates the possibility of tolerating a certain error of positioning when gripping or picking up the module by means of the holding device, whereafter however, a determination is made by the fine positioning process and this is then taken into account in all of the following processing steps so that the actual process of picking up the module by the holding device can be simplified and a not too high level of precision has to be maintained thereby.

In regard to the positioning of the module relative to the currently relevant work station, it has proved to be particularly expedient if a controlled relative positioning between the module carrier and the work station is carried out in each work station, this being effected by positioning elements disposed thereat so that a very high degree of precision can always be maintained in the course of a working step which has to be carried out subsequently.

In regard to the type of working steps provided in a work station, no detailed comments in respect thereof have as yet been made. Thus, one advantageous embodiment envisages that exclusively non-contact making working steps should be carried out in one of the work stations so that the module can continue to be held by the holding device throughout the sequence of working steps carried out in this work station for example.

It is particularly advantageous however, if exclusively non-contact making working steps are carried out in a plurality of the work stations.

Non-contact making working steps of this type may also be of the most varied kinds, for example, it would be conceivable to provide a vaporising process using conventional heating of the material that is to be vaporised as the working step. However, it is advantageous in this case too, if the non-contact making working step is carried out by means of electromagnetic radiation. However, the working steps are capable of being carried out particularly homogeneously if they are carried out using electromagnetic radiation having a spatially uniform energy density distribution since similar physical interactions then take place in the whole processing region, and a reducing projection of complex structures on a mask located in the path of the beam is also possible.

It is particularly advantageous if the non-contact making working step is carried out by means of laser radiation.

A particularly uniform, extensive removal or deposition process can then be carried out in the working steps if the beam profile is rectangular or square since square or rectangular beam profiles can be composed very easily and can be precisely adapted to large surface areas.

The working steps can be carried out in a particularly precise manner however, if they are carried out using pulsed electromagnetic radiation wherein the pulses are so short that a transfer of energy from the electron system into the phonon system of the solid body being processed cannot be transferred during the duration of the pulses.

A particularly high level of precision can then be achieved if the working step is carried out by means of pulsed laser radiation, and preferably laser radiation in the pico-second range or in the femto-second range since a high level of precision can be achieved in any form of processing operation using such types of pulses due to the fact that thermal conduction effects, which have a negative effect on the precision of the processing operation when using laser radiation, can be avoided to a large extent when using laser pulses in the pico-second range.

For example, it would be conceivable for a process of applying a layer to the module to be carried out by means of laser radiation.

However, as an alternative, it would also be conceivable for a process of removing material from the module to be carried out by means of laser radiation.

Another possible form of working step would be the production of a jointed connection on the module by means of a process of supplying energy by electromagnetic radiation, preferably likewise by means of laser radiation.

In regard to the movement of the module carrier to the individual work stations, no detailed comments in respect thereof have as yet been made. Thus, one advantageous embodiment envisages that a module carrier be moved from one work station to another in correspondence with a defined sequence.

However, this method can be developed in a particularly efficient manner if it is not just one module carrier that is moved from one work station to another in correspondence with a defined sequence, but rather, if it is a plurality of module carriers, in the ideal case, a number of module carriers corresponding approximately to the number of work stations, that are moved from one work station to another in correspondence with a defined sequence so that a plurality of module carriers co-operate simultaneously with respective ones of the plurality of work stations.

The defined sequence may thereby either be fixed, or preferably, be freely programmable.

For implementing the movement of the module carriers from work station to work station, provision is preferably made for the module carriers to be movable relative to a base unit, whereby the position of the work stations is preferably fixed relative to the base unit. However, it is also possible to arrange the work stations such that, in addition to the module carriers, they too are movable relative to the base unit.

It is preferable hereby for the module carriers to be movable along arbitrary predefined paths on the base unit so that the method in accordance with the invention demonstrates the greatest degree of flexibility.

The module carriers can then be moved in a particularly expedient manner if they are supplied with control information in non-contact making manner and, for example, if they also transfer test data in non-contact making manner to the central unit.

This control information primarily concerns information in regard to the working steps that are to be carried out.

However, it is also conceivable that information in regard to the paths that are to be followed on the base unit be transmitted in non-contact making manner.

One particularly expedient solution envisages that the positioning of the module carriers should be controlled in non-contact making manner, that is to say, that the detection of the position of the module carrier along its path on the base unit should be effected in non-contact making manner so that the path of the module carrier between two work stations would also be controllable in non-contact making manner.

As an example, another particularly expedient solution envisages that test data in regard to the determination of the position of the module carrier be transmitted to the central unit in non-contact making manner.

In order to supply the module carrier with energy during its movement relative to the base unit, it would be conceivable to supply the energy over a flexible lead for example. However, it is particularly expedient if the module carriers are supplied with energy in non-contact making manner, for example, the transmission of energy could be provided hereby by means of induction, whereby the required energy could be transmitted directly, or, energy could be transmitted which is intermediately stored in the module carrier in an energy store, for example, an accumulator.

Moreover, the invention relates to a device for carrying out working steps on miniaturised modules, said device comprising a module carrier provided with a holding device for holding the modules and a work station for carrying out at least one working step, whereby the object of the invention is achieved in that there are provided a plurality of work stations, in that the module carrier is movable in such a manner that the module is precisely positionable by virtue of a relative movement between the module carrier and the work station for the purposes of carrying out the working steps in the plurality of work stations, and in that the module is adapted to be fixed by the holding device in a single relative position with respect to the module carrier for carrying out the working steps.

By virtue of this solution, it becomes possible to carry out a plurality of operational steps in an efficient manner on the one hand, and with high precision on the other, even in the case of miniaturised modules.

Provision is preferably made thereby for the module to be adapted to be fixed on a gripper head of the module carrier.

Hereby, the gripper could be constructed in the most varied of manners. For example, it would be possible to construct the gripper in the form of an electrostatic gripper which mechanically grips the module by means of an electrostatic drive system. However, a particularly simple type of construction envisages that the gripper head should comprise a vacuum gripper for the module, by means of which said vacuum gripper the module is drawn against a locating surface and is retained in position thereon by the application of a vacuum.

In order to be able to effect an at least adequately precise prepositioning of the module relative to the vacuum gripper during the process of picking up the module, provision is preferably made for a positioning device for the module to be integrated in the vacuum gripper whereby it is possible to grip the module in a positionally precise manner.

Hereby for example, the positioning device could be constructed such that it detects the shape of the module and aligns the vacuum gripper accordingly so that it can then act quickly on the module whereby this rapid gripping action can be effected "blindly" once the vacuum gripper has been aligned. However, it is still more advantageous if the positioning device is formed such that it can detect a marking on the module, which marking is associated with a vacuum chamber of the vacuum gripper, since, in this case, the position of the marking can be detected even as the vacuum gripper is rapidly approaching the module whereby the vacuum gripper can still be controlled even during its rapid approach so as to grip the module in as exact a manner as possible.

Furthermore, in order to then be able to precisely position a module relative to the respective work station after the module has been gripped, provision is preferably made for the gripper head and each of the work stations to comprise mutually co-operating positioning elements with which the gripper head is precisely positionable with respect to the work station. Due to the process of precisely positioning the gripper head relative to the work station on each occasion, this solution offers the chance of positioning the module relative to the gripper head on the one hand, and thereafter of simultaneously precisely positioning the module relative to the work station on the other.

In order to enable the module carrier to be moved relative to the individual work stations, provision is preferably made for the module carrier to comprise a driver unit with which it is movable relative to the base unit. A driver unit of this type may be constructed in the most varied of manners.

For example, it would be conceivable to provide a geared drive for this purpose. However, it is also advantageous to provide an electromagnetic, electrostatic or pneumatic, directly driven linear motor for the purposes of moving the module carrier.

Furthermore, provision is preferably made for the module carrier to comprise a coupling unit with which energy is adapted to be coupled into the module carrier, for example, in an inductive manner.

Hereby, the coupling unit is preferably associated with a respective work station so that when positioning the module carrier near the respective work station, the coupling unit will automatically cater for coupling in the energy required for the functioning of the module carrier.

Moreover, the coupling unit is preferably also utilisable for effecting a coarse positioning of the module carrier on the base unit relative to the currently relevant work station.

In order to be able to effect exact positioning of the gripper head relative to the currently relevant work station, provision is preferably made for the module carrier to comprise positioning units with which the gripper head is movable relative to a base element of the module carrier. The precise positioning of the module relative to the respective work station can then be effected with the aid of this positioning unit.

One particularly advantageous concept of a module carrier in accordance with the invention, envisages that the module carrier should comprise a base element and an extension arm which supports the gripper head, whereby the positioning units are preferably effective between the base element and the extension arm so that the gripper head itself will also be precisely positioned via the extension arm.

In order to be able to control the differing functions of the module carrier in a simple manner, provision is made for the module carrier to comprise a control system with which the gripper head is precisely positionable relative to the base element.

Furthermore, especially for the purposes of controlling a plurality of module carriers in common, provision is made for the control system for the module carrier to communicate with an overall control system for the device in accordance with the invention, whereby said latter system is capable of co-ordinating the relative movements of the plurality of module carriers.

Hereby, provision is preferably made for the control system to communicate with the overall control system by means of a non-contact making transfer of information.

In regard to the precise construction of the work stations, again, no detailed comments in regard thereto have as yet been made. Thus, one advantageous solution envisages that one of the work stations be provided with a source of laser radiation with which the laser radiation that is required for carrying out the working step therein is producible.

For the purposes of producing miniaturised modules in high volumes and with a high throughput, provision is hereby made for each of the work stations that is working with laser radiation to be provided with its own source of laser radiation.

However when producing miniaturised modules as prototypes, working models or in small to middling volumes, provision is preferably made for each of the work stations that is working with laser radiation to be supplied from a common source of laser radiation by means of switchable beam deflectors.

The work station for laser processing the module is preferably constructed such that that the laser radiation emerges from an outlet opening which faces a module positioned in this work station so that it is possible to process the module directly with the laser radiation or to deposit material on this module, whereby the material that is to be deposited is positionable between the outlet opening for the laser radiation and the module.

It is preferable if the material that is to be deposited is initially applied to a transparent support in the form of a prestructured thin film so that it becomes possible to produce a geometrically true transfer of the prestructured film.

It is preferable hereby if the source of laser radiation is constructed such that it produces pulsed laser radiation and it is especially expedient if the source of laser radiation produces laser radiation having pulse durations in the pico-second range or femto-second range.

In order to achieve particularly homogeneous processing or to be able to produce a homogeneous application of an element that is to be positioned on the module, provision is preferably made for the source of laser radiation to produce pulses having a spatially homogenous energy density (top-hat profile).

In order to achieve particularly uniform processing or to be able to produce precise application of an element that is to be positioned on the module, provision is preferably made for the source of laser radiation to produce pulses having a rectangular beam profile.

Further features and advantages of the solution in accordance with the invention form the subject matter of the following description and the sketched illustration of an embodiment of the solution in accordance with the invention.

In the drawing,

FIG. 4, comprising FIGS. 4a+4b: a section through the gripper head in connection with the picking up of a module in a pick up station in accordance with the invention;

FIG. 9, comprising

Figure 1:
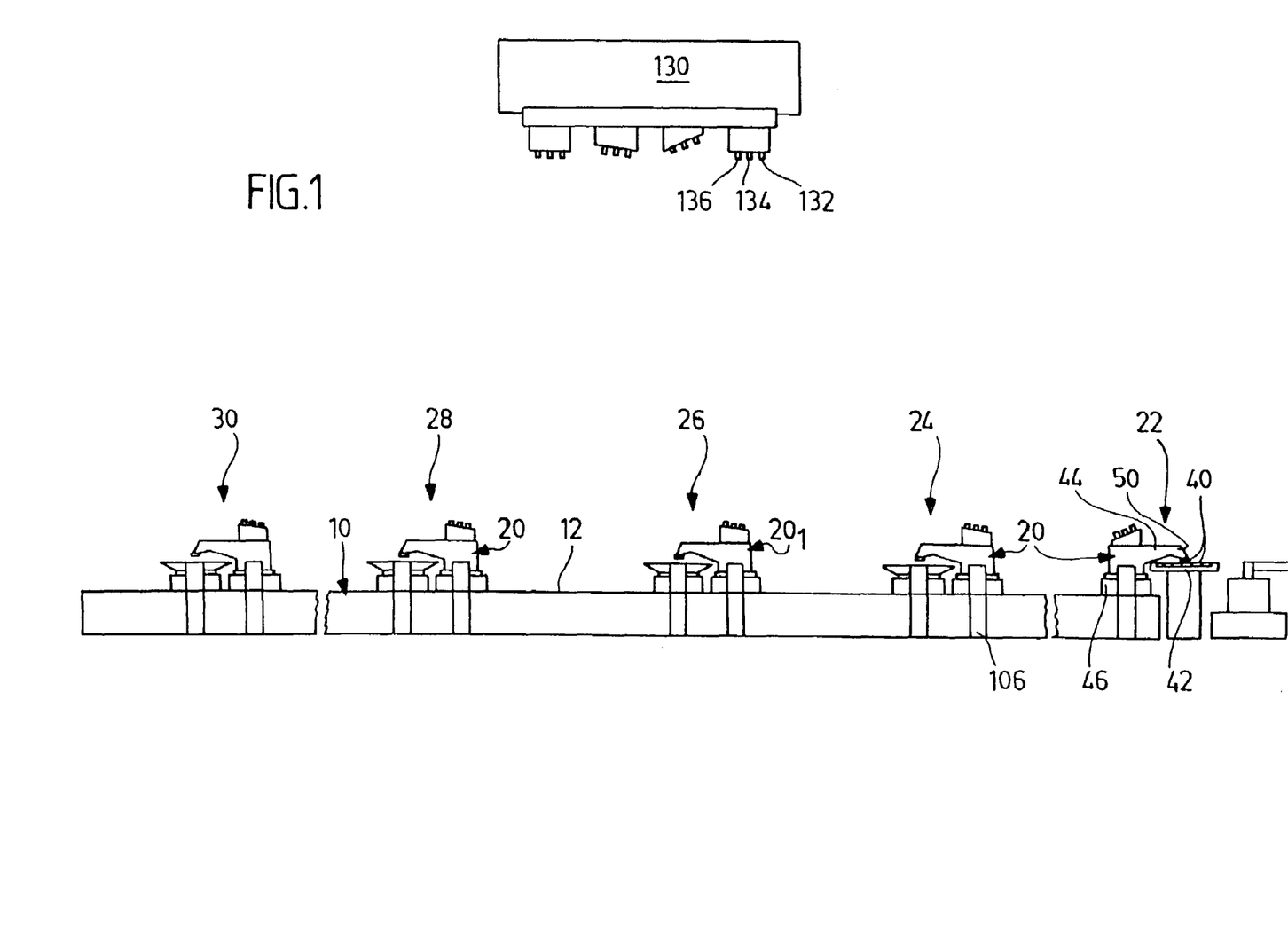
FIG. 1 shows a side view of a device in accordance with the invention.

An embodiment of a device in accordance with the invention for producing and/or processing miniature modules comprises a base unit bearing the general reference 10 which is illustrated in FIG. 1 and which forms a base for a plurality of module carriers 20 that are arranged thereon and are movable on an upper surface 12 of the base unit 10.

Furthermore, there are provided work stations which are fixed relative to the base unit 10 and which are represented for example, by a pick up station 22, a test station 24, a removal station 26, a coating station 28 and a mounting station 30 whose functions will be explained in detail hereinafter.

In the pick up station 22, it is possible for one of the module carriers 20 to pick up a module 40 that is to be processed in accordance with the invention from a table which, for example, is in the form of a magazine and bears the reference 42.

For the purposes of holding a module 40, each of the module carriers 20 is provided with an extension arm 44 which extends in one direction from a foot 46 of the module carrier 20 in the form of a base element and which carries a holding device 48 at its front end.

One of the modules 40 lying on the table 42 is adapted to be gripped by this holding device 48 and is adapted to be lifted from the table 42 by raising the extension arm 44 relative to the foot 46.

Hereby, after the module 40 has been picked up by the holding device 48 and lifted thereby from the table 42, further working steps are effected in the test station 24, the removal station 26, the coating station 28 and the mounting station 30 which will be described in detail hereinafter.

Figure 2:
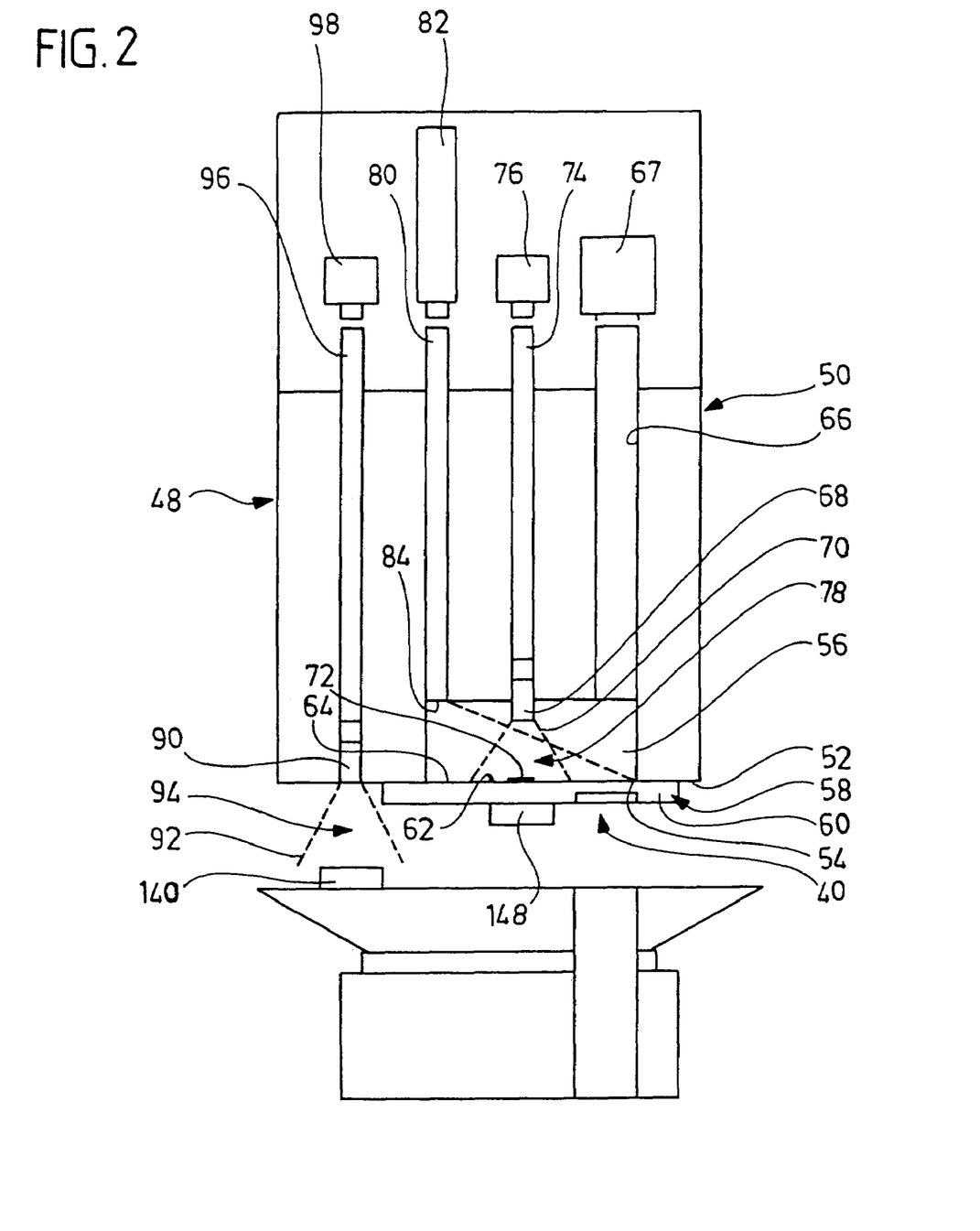
FIG. 2 an enlarged schematic illustration of a section through a gripper head in accordance with the invention.

As is illustrated in detail in FIG. 2, the holding device bearing the general reference 48 comprises a gripper head 50, which is constructed in accordance with the gripper head disclosed in DE 196 37 822 C1 for example, and which is provided with a locating surface 52 of a vacuum gripper 53 for the miniaturised module 40.

The locating surface 52 is, for example, in the form of a plane surface into which there opens an opening 54 of a vacuum chamber bearing the general reference 56 of the vacuum gripper 53 disposed in the gripper head 50, so that the locating surface 52 extends substantially around the opening 54 of the vacuum chamber 56.

Hereby, the opening 54 is preferably dimensioned such that at least an edge region 60 of a base plate 58 of the module 40 projects beyond the edges of the opening 54 so that said base plate is adapted to be placed on the locating surface 52 such as to surround the opening 54.

The vacuum chamber 56 disposed in the gripper head 50 thus faces a central region 62 of the base plate 58 and extends into the gripper head 50 behind the rear face 64 of the base plate 58 where the edge region 60 of the base plate 58 abuts the locating surface 52.

For the purposes of creating a vacuum in the vacuum chamber 56, the latter is connected to a vacuum connection channel 66 that leads to a vacuum producing unit 67 which is not illustrated in detail and which is provided in the respective module carrier 20.

The vacuum connection channel 66 is located such that it opens into the vacuum chamber 56 at an edge position thereof, for example.

An optical imaging system 68 projects into the vacuum chamber 56 so that a marking 72 on the base plate 58, which marking is located within a defined capture region 78 of the optical imaging system defined by the opening angle 70, can be observed thereby, whereby the marking 72 is either arranged on the rear surface 64 or may be arranged on the front face thereof in the case of a transparent base plate 58.

To this end, the end of the optical imaging system 68 opposite the marking 72 is connected to an image conductor 74 which leads to a camera bearing the general reference 76, for example a CCD camera, by means of which the marking. 72 can be observed and its orientation detected.

Hereby, the optical imaging system 68 is located such that its opening angle 70 defining the capture region 78 overlaps the rear face 64 of the base plate 58, namely, in the central region 62 thereof, insofar as the edge regions 60 of the base plate 58 rest on the locating surface 52.

In order to enable the marking 72 on the base plate 58 to be observed, an optical fibre 80 also opens into the vacuum chamber 56, as is likewise illustrated in FIG. 2, said optical fibre being fed into the gripper head 50 from a light source 82 whereby its forward end 84 is aligned such that the rear face 64 and especially the marking 72 on the base plate 58 can be illuminated thereby.

Moreover, an optical imaging system 90 is also provided in the gripper head 50, this system being arranged such that it is not covered thereby when the edge regions 60 of the base plate 58 are located on the locating surface 52, but rather, such that its opening angle 92 will define an observation region 94 which is located near the base plate 58 held by the gripper head 50 and, by means of which, a marking is observable in one of the work stations as will be explained in detail hereinafter.

To this end, the optical imaging system 90 is connected at its end opposite the observation region 94 to an image conductor 96 which leads to a camera 98, which is likewise preferably in the form of a CCD camera, whereby marking elements located in the observation region 94 will be detectable by means of this CCD camera.

Figure 3:
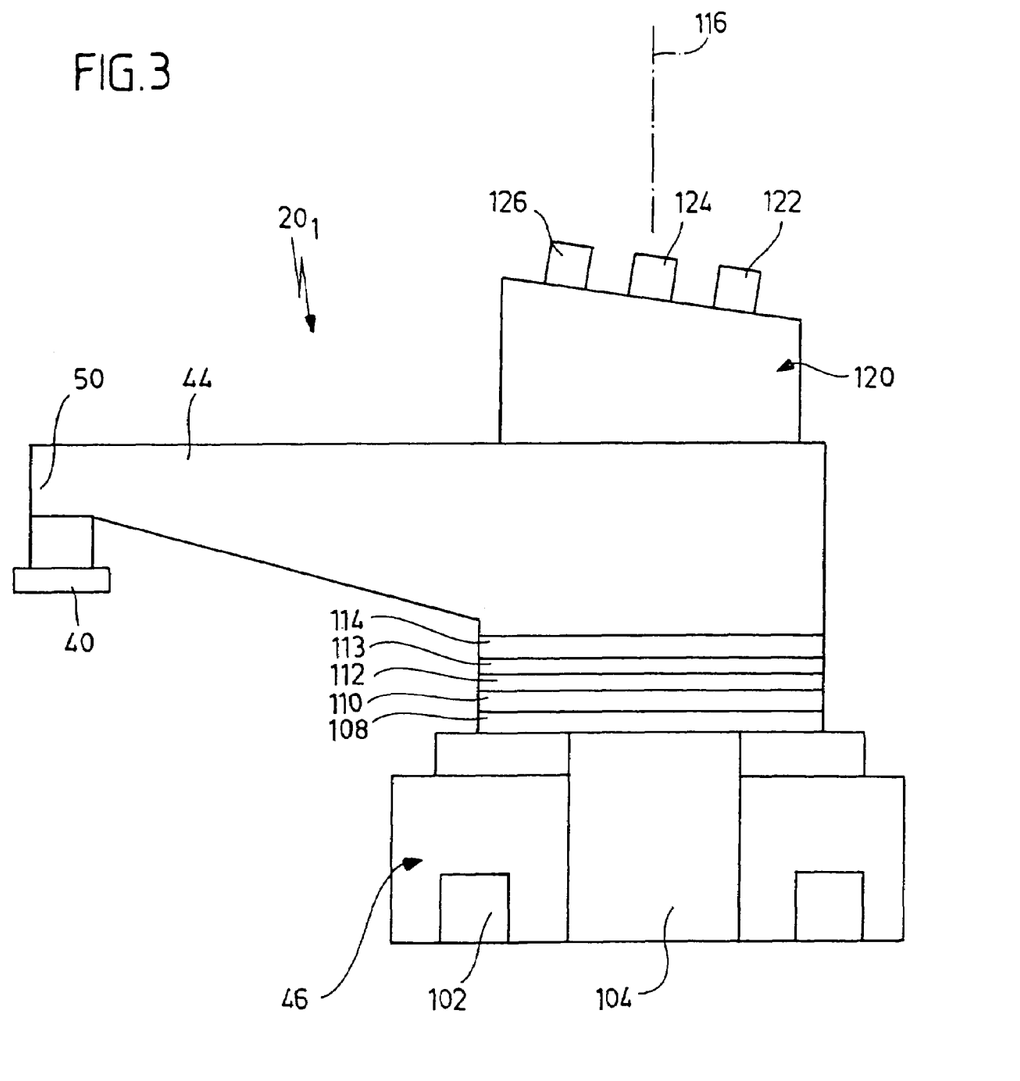
FIG. 3 a partially sectional side view of a module carrier in accordance with the invention.

As is illustrated in FIG. 3, there is provided a drive unit 102 in the foot 46 of each of the module carriers 20 to one side thereof, said drive unit interacting with the base unit 10 in such a manner that it is possible to displace the respective module carrier 20 on the base unit 10. For example, the drive unit 102 may function in the manner of a linear motor.

Furthermore, there is provided a coupling unit 104 in the foot 46, via which said coupling unit, energy can be coupled in from the base unit for example, whereby, for this purpose, the base unit 10 comprises a static coupling device 106 at positions especially provided therefor, said device co-operating with the coupling unit 104 in the foot 46 of the respective module carrier.

In order to enable the gripper head 50 to be moved relative to the foot 46, there are provided an X displacement unit 108, a Y displacement unit 110, and a lifting unit 112, which co-operate in such a manner that they will permit fine positioning of the extension arm 44 and hence of the gripper head 50 relative to the foot 46 in the form of a three-dimensional movement.

Furthermore, optimal alignment of the module 40 in every position is achievable, if, in addition to the X displacement unit 108, the Y displacement unit 110 and the lifting unit 112, there is also provided an X/Y tilting unit 113 and/or a rotating unit 114 which enable the extension arm 40 [sic] to be rotated about an axis 116 extending transversely to, or preferably, perpendicularly to the upper surface 12 of the base unit 10, for example.

Preferably, the coupling unit 104 together with the coupling device 106 in the base unit 10 do not serve exclusively for coupling energy into the respective module carrier 20, but they also simultaneously serve for the process of coarse positioning the foot 46 of the respective module carrier 20 relative to the base unit 10 so that, starting from such a coarse positioning, fine positioning of the module 40 relative to the respective Work station can then be achieved using the X displacement unit 108, the Y displacement unit 110, the lifting unit 112, the X/Y tilting unit 113 and the rotating unit 114.

In order to control the movement of the entire module carrier 20 relative to the base unit 10 by means of the drive unit 102 on the one hand, and for controlling the movement of the extension arm 44 by the gripper head 50 on the other, there is provided a control system bearing the general reference 120 in each of the module carriers 20. Preferably thereby, the control system 120 may interact with an overall control system 130 of the device in accordance with the invention via individual transmitting and receiving devices 122, 124 and 126, said overall control system likewise being provided with corresponding transmitting and receiving devices 132, 134 and 136 which interact with the transmitting and receiving devices 122, 124 and 126 of the control system 120 so as to exchange signals with the overall control system 130 for the purposes of coordinating the functions that are to be executed by the control system 120.

Figure 4A:
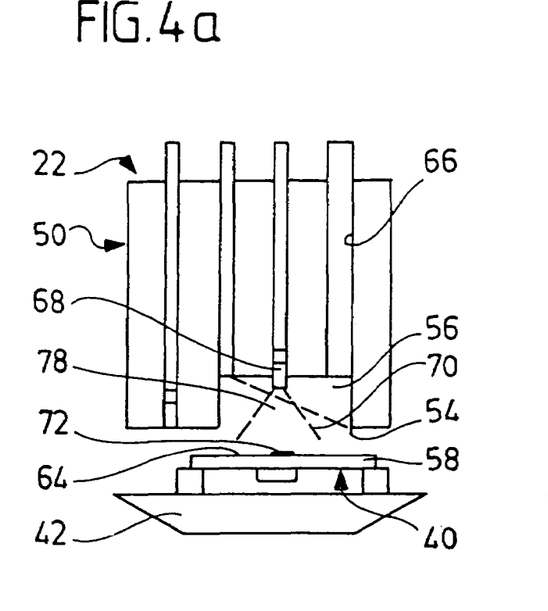
Figure 4B:
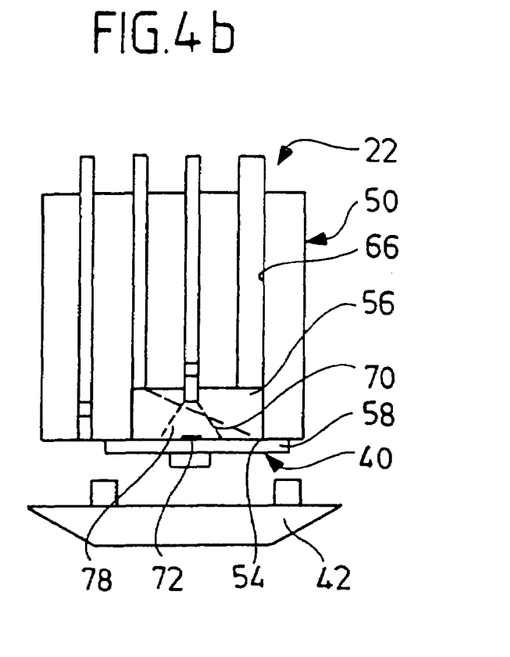

It is thereby possible for the overall control system 130 to cause the control system 120 of one of the module carriers, for example the module carrier $20_1$, to move this module carrier relative to the base unit towards the pick up station 22 and then to grip a module 40 therein as illustrated in FIG. 4b.

To this end, as is illustrated schematically in FIG. 4a, the gripper head 50 is positioned over the module 40 that is to be gripped by controlling the X displacement unit 108, the Y displacement unit 110, and also the rotating unit 114 and the lifting unit 112 in such a manner that the marking 72 on the base plate 58 is detectable in the capture region 78 of the optical imaging system 68.

Positioning of the gripper head 50 relative to the module 40 is immediately possible due to the location and orientation of the marking 72, this positioning thereby also allowing an orientation of the gripper head 50 which is such that the edge regions 60 of the base plate 58 will come to rest on the locating surface 52 in the course of a movement of the gripper head 50 by means of the lifting unit 112 in the direction of the base plate 58. After the gripper head 50 has settled on the base plate 58 resting on the table 42, the edge regions 60 occlude at least two sides of the opening 54 of the vacuum chamber 56 by virtue of the contact with the locating surface 52 so that, when a vacuum is applied in the vacuum chamber 36, the base plate 58 will be firmly retained due to the pressure thereof on the locating surface 52 of the gripper head 50.

Should the gripper head 50 thereafter be lifted again as illustrated in FIG. 4b, then the entire module 40 including especially the base plate 58 can be held by the gripper head 50 and carried away from the table 42. As before, it is thereby possible to continue to observe and check the presence of the gripped base plate 58 on the gripper head 50 by means of the camera 76 on the one hand, and the location of the marking 72 in the capture region 78 on the other.

A module 40 held and gripped by the module carrier 20, in this manner can be moved to the next work station i.e. the test station 24, by moving the entire module carrier 20 relative to the base unit 10 by means of the drive unit 102 for example.

Figure 5:
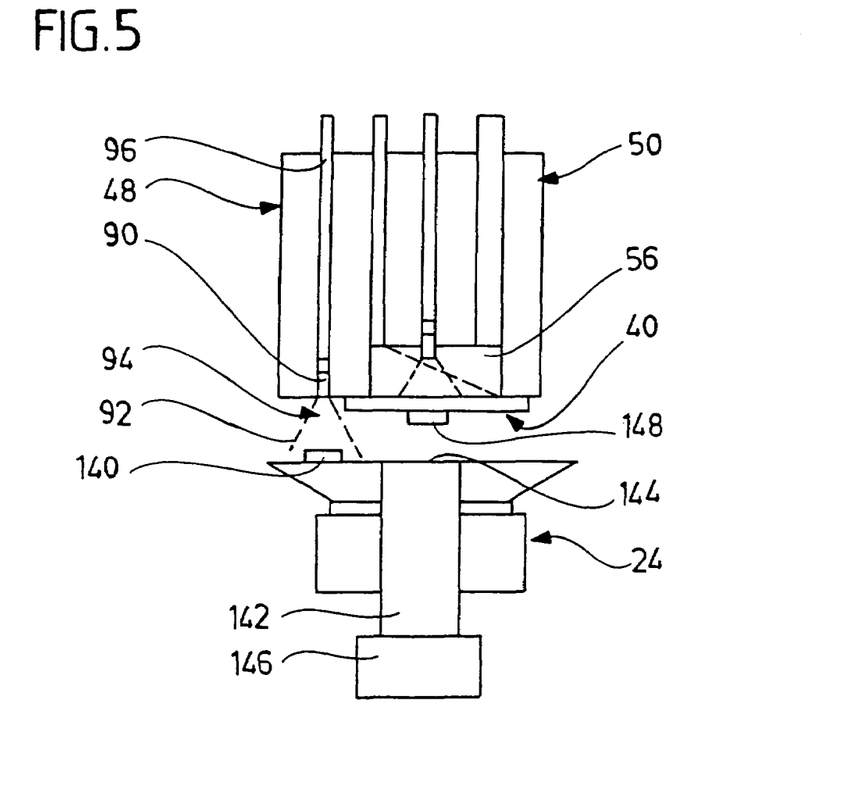
FIG. 5 a section through the gripper head in connection with the process of fine positioning the module in a test station in accordance with the invention.

As is illustrated in FIG. 5, a precise relative positioning of the gripper head 50 relative to the test station 24 itself is initially effected in the test station 24.

To this end, the test station 24 is provided with a position marking arrangement 140 which, when it is located in the observation region 94 of the camera 98, allows the control system 120 to dispose the gripper head in an exact position relative to the test station 24 through precise observation of the position marking arrangement 140. A precise disposition of the module 40 relative to the test station 24 is thereby inevitably possible too, whereby the module 40 continues to be held by the gripper head by virtue of the vacuum in the vacuum chamber 56.

Based upon such an exact positioning process, the precise location of the module 40 can be detected and measured when the gripper head 50 is precisely positioned relative to the test station 24 by means of an optical observation system 42 [sic] which is provided in the test station 24 and which incorporates an observation face 144 facing the module 40 and a camera 146 that is disposed at the end of the optical observation system 142 opposite the observation face 144. To this end for example, each module 40 is provided with a test marking 148 whose position is precisely detectable by the camera 146 via the optical observation system 142, whereby not only is it possible to precisely detect the test marking 148 in the X/Y plane that extends approximately parallel to the upper surface 12, but it is also simultaneously possible to precisely detect the spacing of the module 40 from the observation face 144 so that it is possible to effect a calibration process in regard to the exact relative location of the module 40 with respect to the test station 24.

As an alternative to defining the location of the test marking 148 on the module 40, it would also be conceivable for the extent of the base plate 58 of the module to be determined by means of the camera 146 and the optical observation system 142 insofar as the shape and size of the base plate 58 cannot be precisely predefined.

This thereby also allows a calibration of the relative position of the module 40 with regard to the position marking 140 as observed by the camera 98 to be undertaken. This calibration can then be used again in each of the other work stations so as to enable the module 40 to be precisely positioned relative to the individual work stations insofar as the relative position of the module 40 with respect to the gripper head 50 is maintained.

Following the exact measurement process of the module 40 in the test station 24, the module carrier 20$_1$ is then again controlled by the overall control system 30 [sic] and the control system 120 such that it is moved to the removal station 26.

Figure 6:
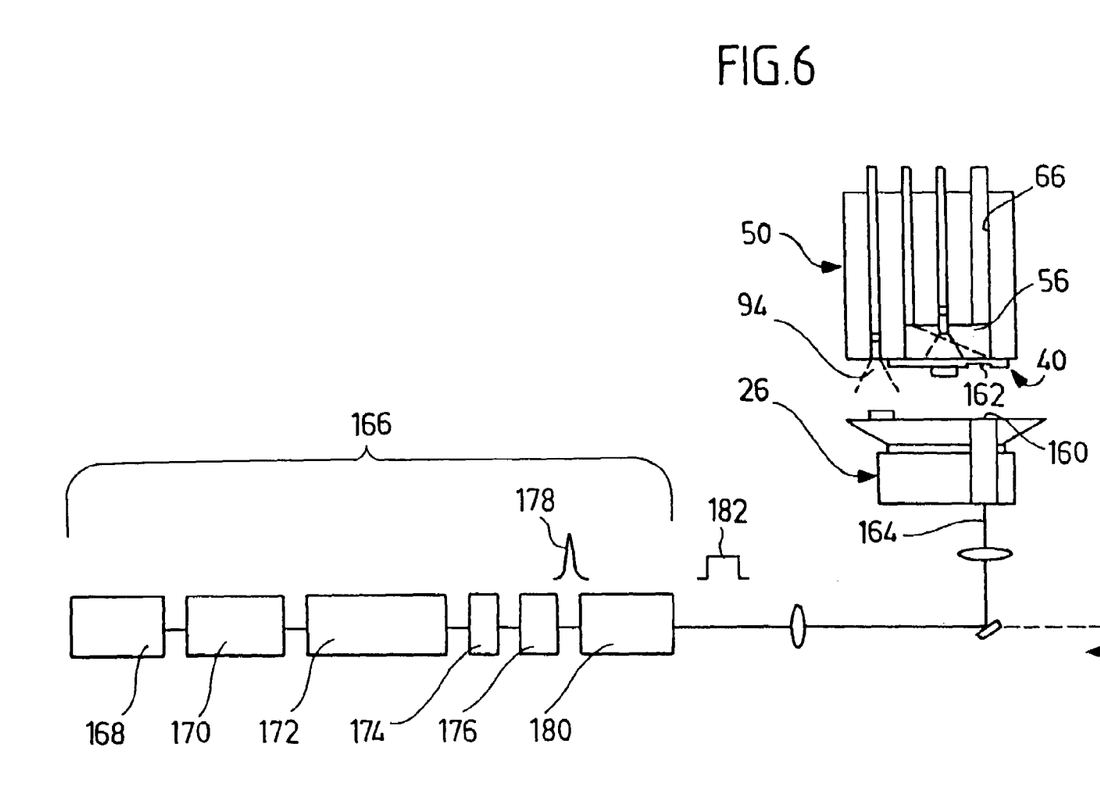
FIG. 6 a section through the gripper head in connection with the process of removing material in a removal station in accordance with the invention.

In the removal station 26, exact positioning of the gripper head 50 relative to the removal station 26 is effected once more by means of a position marking arrangement 140, which is arranged in a similar manner to that in the test station and is detectable by the camera 98 via the observation region 94. Thereby, not only can the gripper head 50 be precisely positioned relative to the position marking arrangement 140, but at the same time, correction of a possibly non exact relative positioning of the module 40 relative to the gripper head can be effected, whereby the correction corresponds to the calibration which was effected at the test station 24.

By virtue of this exact positioning of the module 40 relative to the removal station 26, it is also possible to achieve exact positioning of an outlet opening 160 for laser radiation in the removal station 26 relative to a surface region 162 wherein it is intended to remove some material, whereby the surface region 162 is precisely positioned opposite the outlet opening 160 due to the precise positioning process.

A laser beam 164 that is suitable for removing material in non-contact making manner preferably emerges from the outlet opening 160, whereby said laser beam is producible by a laser radiation source bearing the general reference 166. This laser radiation source 166 comprises, for example, a pump laser 168 which is used to pump a fibre laser 170 having an amplifier 172 connected to the output thereof, whereby the laser 170 and the amplifier 172 produce laser pulses having a pulse duration which preferably lies in the pico-second range. A power output control unit 174 followed by a pulse selection system 176 is connected to the output of the amplifier 172 thereby enabling individual laser pulses 178 to be selected, these laser pulses 178 being schematically illustrated in FIG. 6 and having a Gauss-like beam profile for example.

Since, due to its very uneven distribution of energy, a Gauss-like beam profile would lead to problems when removing material in the surface region 162, there is preferably provided a beam shaping optical system 180 by means of which a laser pulse 182 is producible from the laser pulse 178 having a Gauss-like beam profile, whereby a substantially rectangular beam profile or a top-hat shaped beam profile of the laser pulse 182 is producible.

Figure 7:
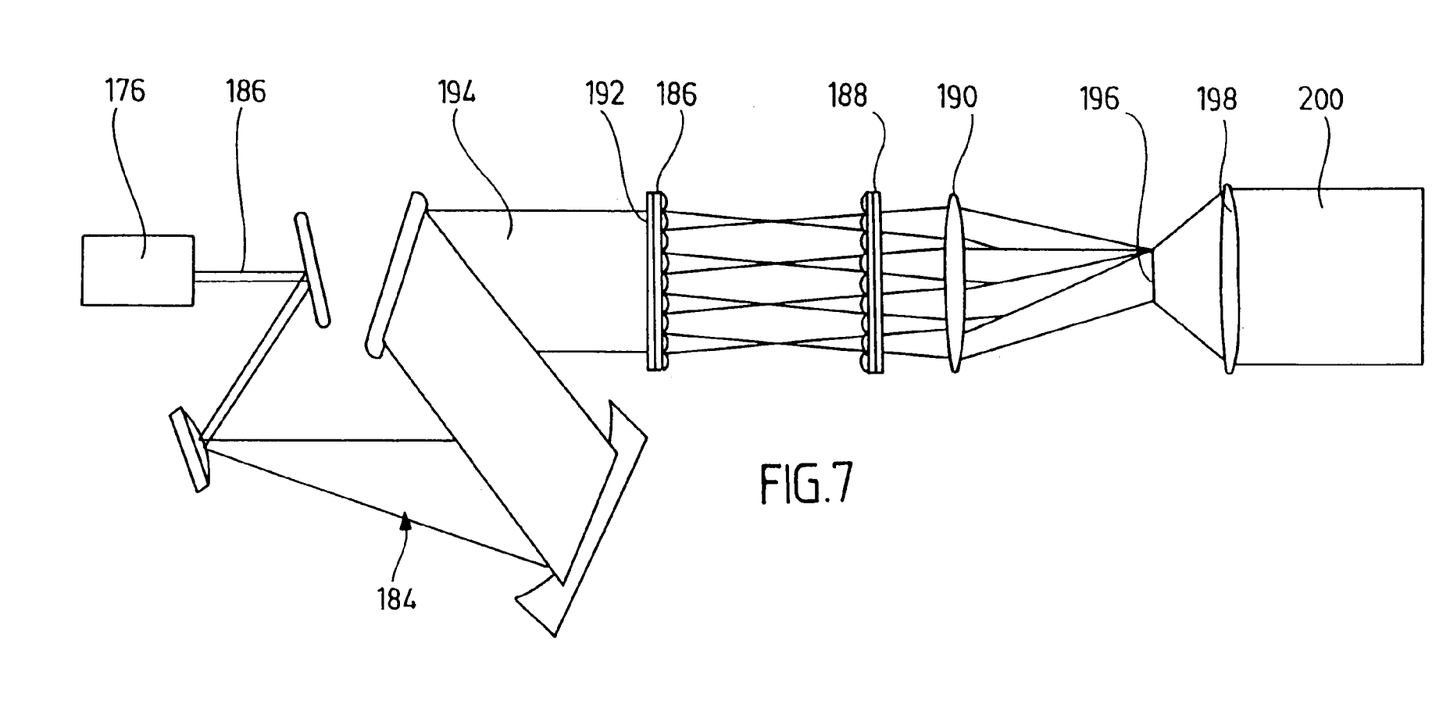
FIG. 7 a schematic illustration of a beam shaping optical system in accordance with the invention.

An exemplary beam shaping optical system 180 of this type is illustrated in FIG. 7 by way of example.

To start with, this comprises a telescope 184 which broadens the laser beam 186 emerging from the pulse selection system 176. Thereafter, with the aid of two micro-lens arrangements 186 and 188 and a subsequent collector lens 190, the individual segments 192 of the broadened laser beam 194 are superimposed to form a spot image 196, whereby the spot image 196 takes the form of the image of one of the segments 192, all of which segments are superimposed in the spot image 196. The result is thereby achieved that the sum of the superimposed powers of all of the beam segments 192 is approximately equally large so that the laser beam 200, which has the desired rectangular beam profile, is then obtainable in a further imaging process by means of a collector lens 198.

Following the removal of material from the surface region 162, the module carrier 20$_1$ can be moved on again to the next station by means of the overall control system 130 and the control system 120, namely, to the coating station 28 in which, for example, a layer is to be applied to the surface region 162 as is illustrated in FIG. 7 [sic]. To this end, the process of precisely positioning the entire module 40 by means of a position marking arrangement 140 that is likewise provided at the coating station 28 takes place in a similar manner to that which has already been described in connection with the removal station 26, a correction process likewise been affected simultaneously in correspondence with the result of the calibration process in the test station 24.

Furthermore, above an outlet opening 210 for a laser beam 212 in the coating station 28, there is provided a support 214 which comprises the layer segments 216 that are to be applied to the module 40. By positioning a layer segment 216$_1$, that is illustrated by the dotted lines in FIG. 8 and which is to be transferred to the module 40, above the outlet opening 210 for the laser beam 212, and by correspondingly positioning the surface region 162 on the side of the layer segment 216 opposite the outlet opening 210, it becomes possible to transform the entire layer segment 216$_1$, onto the surface region 162 in a non-contact making manner with the aid of the laser beam 212, whereby a transformation process similar to the known LIFT processes occurs but with the difference however, that the laser beam 212 is formed by one or more pulses having a pulse duration in the pico-second range so that, in contrast to the LIFT processes, the material of the layer segment 216$_1$, does not melt but is transferred in its entirety so that it is possible to produce an accurately positioned and accurately shaped transfer thereof. This advantage is achieved by virtue of the fact that there is a build up of vapour at the boundary surface between the layer segment 216 and the carrier 214 due to the shortness of the laser pulse, this build up of vapour being responsible for the rapid transfer of the entire layer segment 216$_1$, onto the surface region 162 which, in turn, contributes to the positive adhesion of the layer segment 216 to the surface region 162.

Figure 8:
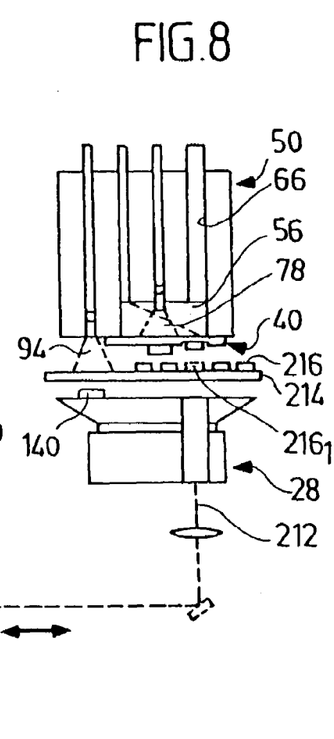
FIG. 8 section through the gripper head in connection with the illustration of a process of applying a coating to the module in a coating station in accordance with the invention.

The laser beam 212 preferably has a rectangular beam profile 182, which can be obtained by means of the beam shaping optical system 180, in like manner to that of the laser beam 164.

A process of coating the module 40 of this type can be effected several times over, for example, by moving the support 214 in the coating station 28.

Following the process of coating the module 40, on both sides of the test marking 148 for example, such a module 40 can be transported to the mounting station 30 by moving the module carrier 20$_1$, under the control of the overall control system 130 and the control system 120 for the relevant module carrier, whereby, it is then possible to mount the module 40 on a base module 220 which is provided in the mounting station 30, as is illustrated in FIG. 9.

Figures 9A, 9B, 9C:
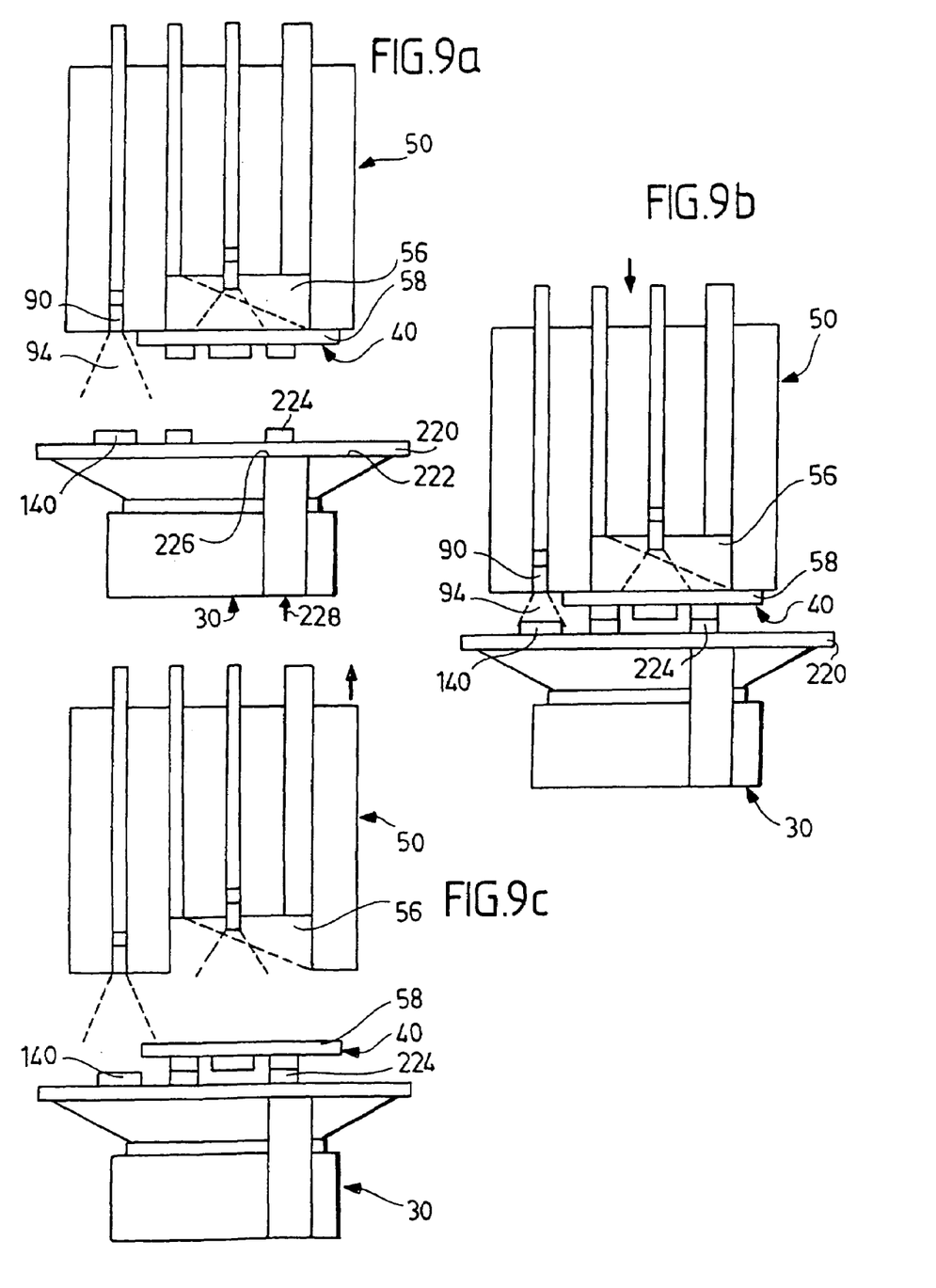
FIGS. 9a–9c: a section through the gripper head in connection with the mounting of the module in accordance with the invention on a base module.

The base module 220 likewise bears the position marking arrangement 140 and this thereby allows the gripper head 50 to be precisely positioned relative thereto. Furthermore, the base module 220 is located on a positioning surface 222 of the mounting station 30, that a layer element 224, which is to be connected to the transferred layer segment 216 by a jointing process, is located above an outlet opening 226 for a jointing laser beam 228. By precisely placing the module 40 on to the basic module 220 in such a manner that the layer segment 216 rests on the layer element 224 as illustrated in FIG. 9*b*, and, by turning on the jointing laser pulse 228, it becomes possible for the layer element 224 of the base module 220 to be welded to the layer segment 216 of the module 40 so that the module 40 is thereby connected to the base module 220 as is illustrated in FIG. 8*b* [sic]. It is possible to release the module 40 from the gripper head 50 after connecting the base module 220 and the module 240 [sic] together, by aerating the vacuum chamber 56 as is illustrated in FIG. 9*c*, so that the module 40, which is precisely positioned on the base module 220 and is connected thereto, is now located at the mounting station 30 so that this entity can be transported away by any arbitrary forms of transportation unit or else by means of one of the module carriers 20.

The invention claimed is:

1. A method for carrying out working steps on miniaturized modules, comprising:
    providing a plurality of workstations arranged on a base unit;
    providing a plurality of module carriers for miniaturized modules, the plurality of module carriers cooperating simultaneously with respective ones of the plurality of work stations;
    providing a gripper head and a base element for each module carrier;
    for each of said module carriers, enabling movement of said gripper head relative to said respective work station for carrying out said working steps by:
        (i) enabling movement of said gripper head relative to the base element of said module carrier in at least three directions of at least three linear axes of movement, each linear axis allowing movement for fine positioning in a direction transverse to the other ones and said movement being provided by a respective positioning unit arranged between said gripper head and said base element; and
        (ii) enabling movement of said base element on said base unit and relative to said base unit for coarse positioning in a direction of at least one axis.

2. A method in accordance with claim 1, wherein said base element is moveable relative to said base unit in at least two directions of at least two axes of movement, each axis allowing movement in a direction transverse to the other one.

3. A method in accordance with claim 1, wherein said gripper head is moveable relative to said base element in a fourth direction of a fourth axis of movement.

4. A method in accordance with claim 3, wherein said gripper head is moveable relative to said base element in a fifth direction of a fifth axis of movement.

5. A method in accordance with claim 1, wherein said base element is moveable along arbitrary predefined paths relative to said base unit.

6. A method in accordance with claim 1, wherein a module carrier is moved from one work station to another in a defined sequence.

7. A method in accordance with claim 1, wherein at least one of said work stations is moveable relative to said base unit.

8. A device for carrying out working steps on miniaturized modules, comprising:
    a plurality of work stations arranged on a base unit;
    a plurality of module carriers for miniaturized modules, the plurality of module carriers cooperating simultaneously with respective ones of the plurality of work stations;
    each module carrier having a gripper head and a base element, said gripper head being movable relative to said respective work station; and
    at least three positioning units for enabling precision movement of said gripper head relative to said base element, each of said positioning units enabling movement of said gripper head relative to said base element in a direction of a respective linear axis of movement, each linear axis allowing movement in a direction transverse to the other ones;
    said base element being moveable on said base unit and relative to said base unit for coarse positioning in at least one direction.

9. A device in accordance with claim 8, wherein said base element is moveable relative to said base unit in at least two directions of at least two respective axes of movement, each axis allowing movement in a direction transverse to the other one.

10. A device in accordance with claim 8, wherein the base element comprises a driver unit.

11. A device in accordance with claim 8, wherein the gripper head is moveable relative to said base element in a fourth direction of a fourth axis of movement.

12. A device in accordance with claim 11, wherein the gripper head is moveable relative to said base element in a fifth direction of a fifth axis of movement.

13. A device in accordance with claim 8, wherein said base element is moveable along arbitrary predefined paths relative to said base unit.

14. A device in accordance with claim 8, wherein a module carrier is moved from one work station to another in a defined sequence.

15. A device in accordance with claim 8, wherein at least one of said work stations is moveable relative to said base unit.

16. A method for carrying out working steps on miniaturized modules, comprising:
    providing at least one work station arranged on a base unit;
    providing a module carrier for miniaturized modules, said module carrier having a gripper head and a base element, enabling movement of said gripper head relative to said work station for carrying out said working steps by:
        (i) enabling movement of said gripper head relative to said base element of said module carrier in at least three directions of at least three linear axes of movement, each linear axis allowing precision movement in a direction transverse to the other ones, and movement of said gripper head relative to said base element about a fourth axis, being a tilting axis, and about a fifth axis, being a rotational axis, and said movement being provided by a respective positioning unit arranged between said gripper head and said base element, and
        (ii) enabling movement of said base element on said base unit and relative to said base unit for coarse positioning in a direction of at least one axis;
    wherein said at least one work station comprises one of a pick up station, a test station, a removal station, a coating station, and a mounting station.

17. A method in accordance with claim 16, wherein said base element is moveable relative to said base unit in at least two directions of at least two axes of movement, each axis allowing movement in a direction transverse to the other one.

18. A method for carrying out working steps on miniaturized modules, comprising:
providing at least one work station arranged on a base unit;
providing a module carrier for miniaturized modules, said module carrier having a gripper head and a base element, enabling movement of said gripper head relative to said work station for carrying out said working steps by:
  (i) enabling movement of said gripper head relative to said base element of said module carrier in at least three directions of at least three axes of movement, each axis allowing precision movement in a direction transverse to the other ones and said movement being provided by respective positioning unit arranged between said gripper head and said base element; and
  (ii) enabling movement of said base element on said base unit and relative to said base unit for coarse positioning in a direction of at least one axis; and
wherein said at least one work station comprises one of a pick up station, a test station, a removal station, a coating station, and a mounting station.

19. A method for carrying out working steps on miniaturized modules in at least one work station, comprising:
at least one work station being arranged on a base unit;
providing a module carrier for miniaturized modules, said module carrier having a gripper head and a base element;
enabling movement of said gripper head relative to said work station for carrying out said working steps by
  (i) enabling movement of said gripper head relative to a base element of said module carrier in at least three directions of at least three linear axis of movement, each linear axis allowing movement in a direction transverse to the other ones and said movement being provided by a respective positioning unit arranged between said gripper head and said base element; and
  (ii) enabling movement of said base element on said base unit and relative to said base unit in a direction of at least one axis;
wherein said at least one work station comprises one of a pick up station, a test station, a removal station, a coating station and a mounting station.

20. A method in accordance with claim 19, wherein said base element is moveable relative to said base unit in at least two directions of at least two axes of movement, each axis allowing movement in a direction transverse to the other one.

21. A method in accordance with claim 19, wherein said gripper head is moveable relative to said base element in a fourth direction of a fourth axis of movement.

22. A method in accordance with claim 21, wherein said gripper head is moveable relative to said base element in a fifth direction of a fifth axis of movement.

23. A method in accordance with claim 19, wherein said base element is moveable along arbitrary predefined paths relative to said base unit.

24. A method in accordance with claim 19, wherein a plurality of module carriers is provided.

25. A method in accordance with claim 19, wherein a plurality of work stations is provided.

26. A method in accordance with claim 19, wherein a plurality of module carriers and a plurality of work stations is provided.

27. A method in accordance with claim 26, wherein the plurality of module carriers cooperates simultaneously with respective ones of the plurality of work stations.

28. A method in accordance with claim 19, wherein a module carrier is moved from one work station to another in a defined sequence.

29. A method in accordance with claim 19, wherein the at least one work station is moveable relative to said base unit.

30. A device for carrying out working steps on miniaturized modules, comprising:
at least one work station being arranged on a base unit;
a module carrier for miniaturized modules, said module carrier having a gripper head and a base element, said gripper head being movable relative to said work station; and
at least three positioning units for enabling movement of said gripper head relative to said base element, each of said positioning units enabling movement of said gripper head relative to said base element in a direction of a respective linear axis of movement, each linear axis allowing movement in a direction transverse to the other ones;
said base element being moveable on said base unit and relative to said base unit in at least one direction;
wherein said at least one work station comprises one of a pick up station, a test station, a removal station, a coating station and a mounting station.

31. A device in accordance with claim 30, wherein said base element is moveable relative to said base unit in at least two directions of at least two respective axes of movement, each axis allowing movement in a direction transverse to the other one.

32. A device in accordance with claim 30, wherein the base element comprises a driver unit.

33. A device in accordance with claim 30, wherein the gripper head is moveable relative to said base element in a fourth direction of a fourth axis of movement.

34. A device in accordance with claim 33, wherein the gripper head is moveable relative to said base element in a fifth direction of a fifth axis of movement.

35. A device in accordance with claim 30, wherein said base element is moveable along arbitrary predefined paths relative to said base unit.

36. A device in accordance with claim 30, wherein a plurality of module carriers is provided.

37. A device in accordance with claim 30, wherein a plurality of work stations is provided.

38. A device in accordance with claim 30, wherein a plurality of module carriers and a plurality of work stations is provided.

39. A device in accordance with claim 38, wherein the plurality of module carriers cooperates simultaneously with respective ones of the plurality of work stations.

40. A device in accordance with claim 30, wherein a module carrier is moved from one work station to another in a defined sequence.

41. A device in accordance with claim 30, wherein the at least one work station is moveable relative to said base unit.

* * * * *